(12) United States Patent
Manabe et al.

(10) Patent No.: US 8,817,154 B2
(45) Date of Patent: Aug. 26, 2014

(54) IMAGE SENSOR WITH FIXED POTENTIAL OUTPUT TRANSISTOR

(75) Inventors: Sohei Manabe, San Jose, CA (US); Jeong-Ho Lyu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 133 days.

(21) Appl. No.: 13/599,343

(22) Filed: Aug. 30, 2012

(65) Prior Publication Data
US 2014/0063304 A1 Mar. 6, 2014

(51) Int. Cl.
H04N 3/14 (2006.01)
H04N 5/335 (2011.01)

(52) U.S. Cl.
USPC .................. 348/308; 348/272; 348/296

(58) Field of Classification Search
CPC ........ H04N 3/155; H04N 5/378; H04N 5/335
USPC ................. 348/308, 276, 292; 250/208.1
See application file for complete search history.

(56) References Cited

U.S. PATENT DOCUMENTS

| 2007/0035649 A1* | 2/2007 | McKee | 348/308 |
| 2007/0272828 A1* | 11/2007 | Xu | 250/208.1 |
| 2010/0013972 A1* | 1/2010 | Adkisson et al. | 348/308 |
| 2010/0188546 A1* | 7/2010 | Mckee | 348/308 |
| 2011/0205416 A1* | 8/2011 | Nishihara | 348/300 |

OTHER PUBLICATIONS

Mutoh, N. et al., "New Low Noise Output Amplifier for High Definition CCD Image Sensor," NEC Corporation, Japan, IEEE 1989, IEDM 89-173-IEDM 89-176, 4 pages.
Sakakibara, M. et al., "An 83dB-Dynamic-Range Single-Exposure Global-Shutter CMOS Image Sensor with In-Pixel Dual Storage," ISSCC 2012/ Session 22/ Image Sensors/ 22.1, 2012 IEEE International Solid-State Circuits Conference, Digest of Technical Papers, pp. 380-382.
Solhusvik, J. et al., "A 1.2MP 1/3" Global Shutter CMOS Image Sensor with Pixel-Wise Automatic Gain Selection," R53, Internet download from Google Search on Aug. 29, 2012, 3 pages.

* cited by examiner

*Primary Examiner* — Gevell Selby
(74) *Attorney, Agent, or Firm* — Blakely Sokoloff Taylor & Zafman LLP (57) ABSTRACT

An image sensor pixel includes a photosensitive region and pixel circuitry. The photosensitive region accumulates an image charge in response to light incident upon the image sensor. The pixel circuitry includes a transfer-storage transistor, a charge-storage area, an output transistor, and a floating diffusion region. The transfer-storage transistor is coupled between the photosensitive region and the charge-storage area. The output transistor has a channel coupled between the charge-storage area and the floating diffusion region and has a gate tied to a fixed voltage potential. The transfer-storage transistor causes the image charge to transfer from the photosensitive region to the charge-storage area and to transfer from the charge-storage area to the floating diffusion region.

18 Claims, 8 Drawing Sheets

GLOBAL TRANSFER FROM PHOTOSENSITIVE REGION TO CHARGE-STORAGE AREA

TS: TRANSFER-STORAGE TRANSISTOR
RST: RESET TRANSISTOR
SVDD: VOLTAGE RAIL
DRK: DARK-CURRENT READ
SIG: IMAGE SIGNAL READ

FIG. 7B

ROW BY ROW READOUT TIMING

ROW BY ROW TRANSFER FROM CHARGE-STORAGE AREA TO FLOATING DIFFUSION REGION

FIG. 7C

IMAGE SENSOR WITH FIXED POTENTIAL OUTPUT TRANSISTOR

TECHNICAL FIELD

This disclosure relates generally to image sensors, and in particular but not exclusively, relates to image sensors with global shutters.

BACKGROUND INFORMATION

Image sensors are ubiquitous. They are widely used in many different types of applications. In certain types of applications such as the medical field, the size and image quality of image sensors are particularly important. Consequently, there is a demand for the miniaturization of image sensors without compromising image quality.

Figure 1:
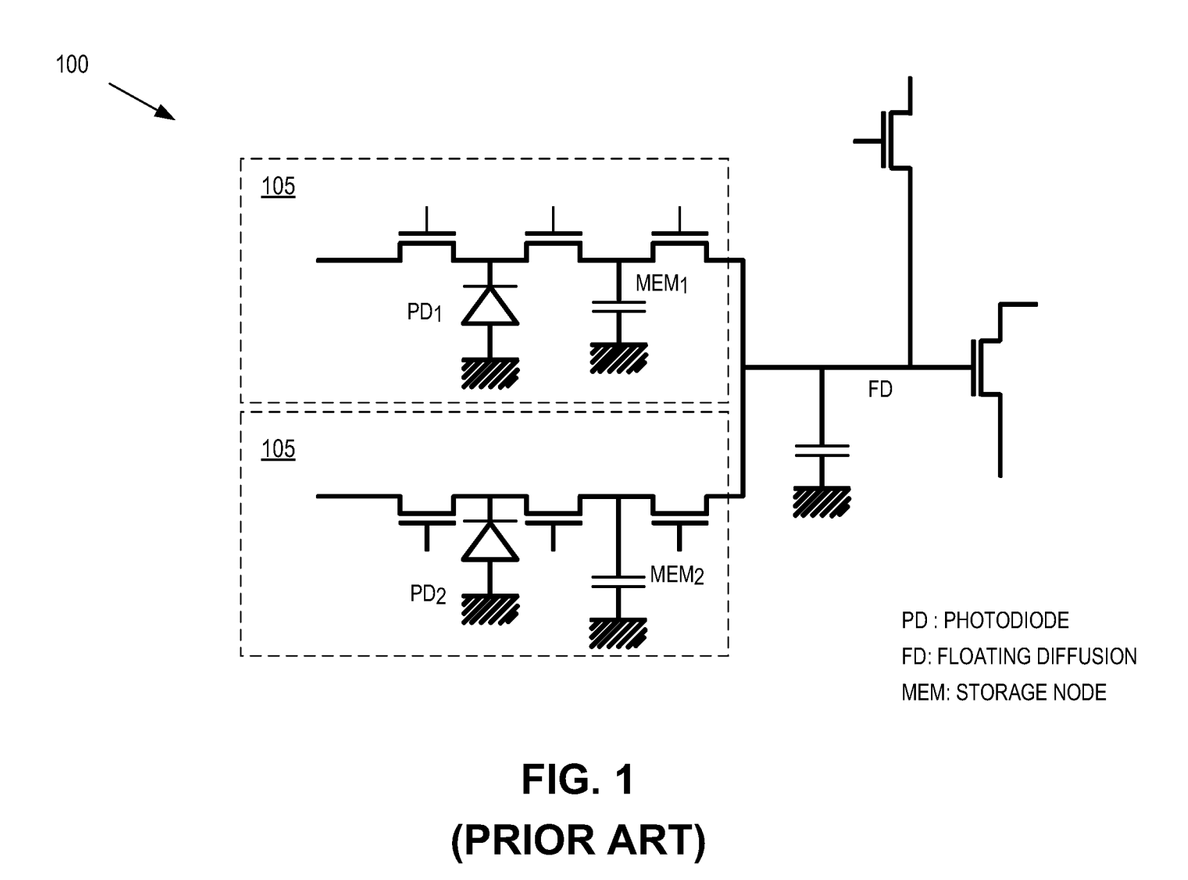
FIG. 1 (PRIOR ART) is a circuit diagram illustrating conventional shared pixel architecture.

FIG. 1 is a circuit diagram illustrating conventional shared pixel architecture 100. Shared pixel architecture 100 includes pixel circuitry 105 of two pixels within an image sensor. Each pixel circuitry 105 includes a photodiode region ("PD") and transistor circuitry that provides a variety of functionality for regular operation of each pixel. For example, pixel circuitry 105 may include circuitry to commence an accumulation of image charge within photodiode region PD, to reset the image charge within photodiode region PD, to transfer the image charge to a storage node ("MEM"), and to transfer the image charge to a floating diffusion region ("FD"). To control this functionality, pixel circuitry 105 requires wiring that consumes valuable space within each pixel at the expense of photodiode region PD. Accommodating this wiring within each pixel reduces the area of photodiode region PD that is exposed to light, thereby reducing the fill factor of the pixel and degrading pixel sensitivity and image quality.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. The drawings are not necessarily to scale, emphasis instead being placed upon illustrating the principles being described.

DETAILED DESCRIPTION

Embodiments of a system and method for operation of an image sensor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 2:
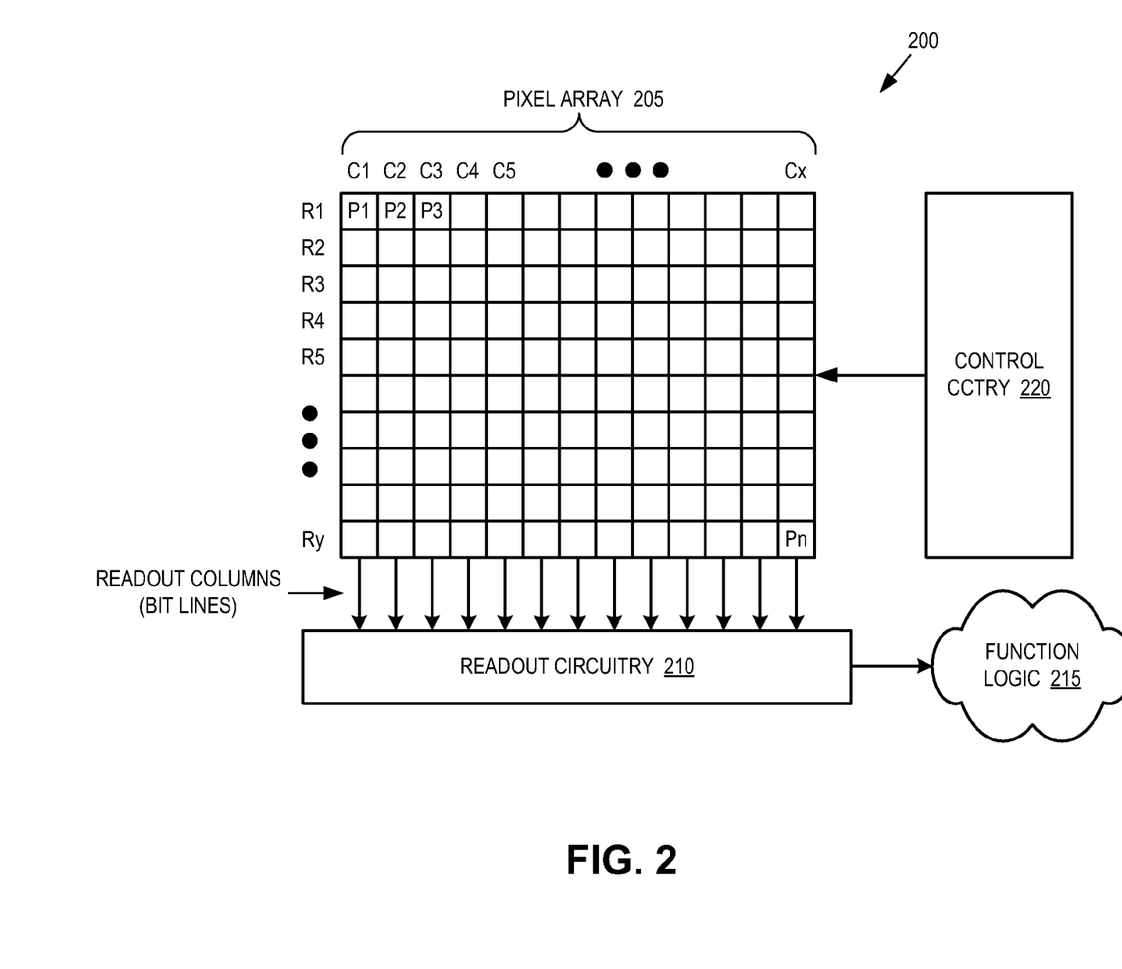
FIG. 2 is a functional block diagram illustrating an imaging system, in accordance with an embodiment of the disclosure.

FIG. 2 is a block diagram illustrating an imaging system 200, in accordance with an embodiment of the invention. The illustrated embodiment of imaging system 200 includes a pixel array 205, readout circuitry 210, function logic 215, and control circuitry 220.

Pixel array 205 is a two-dimensional ("2D") array of pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image charge is read out by readout circuitry 210 and transferred to function logic 215. Readout circuitry 210 may include amplification circuitry, analog-to-digital ("ADC") conversion circuitry, or otherwise. Function logic 215 may simply store the image charge or even manipulate the image charge by applying post image effects (e.g., crop, rotate, remove red eye, adjust brightness, adjust contrast, or otherwise). In one embodiment, readout circuitry 210 may read out a row of image charge at a time along readout column lines (bit lines) or may read out the image charge using a variety of other techniques (not illustrated), such as a serial readout or a full parallel readout of all pixels simultaneously.

Control circuitry 220 is coupled to pixel array 205 to control operational characteristic of pixel array 205. For example, control circuitry 220 may generate a shutter signal for controlling image acquisition. In one embodiment, the shutter signal is a global shutter signal for enabling all pixels within pixel array 205 to simultaneously capture their respective image charge during a single acquisition window. In an alternative embodiment, the shutter signal is a rolling shutter signal whereby each row, column, or group of pixels is sequentially enabled during consecutive acquisition windows.

Figure 3:
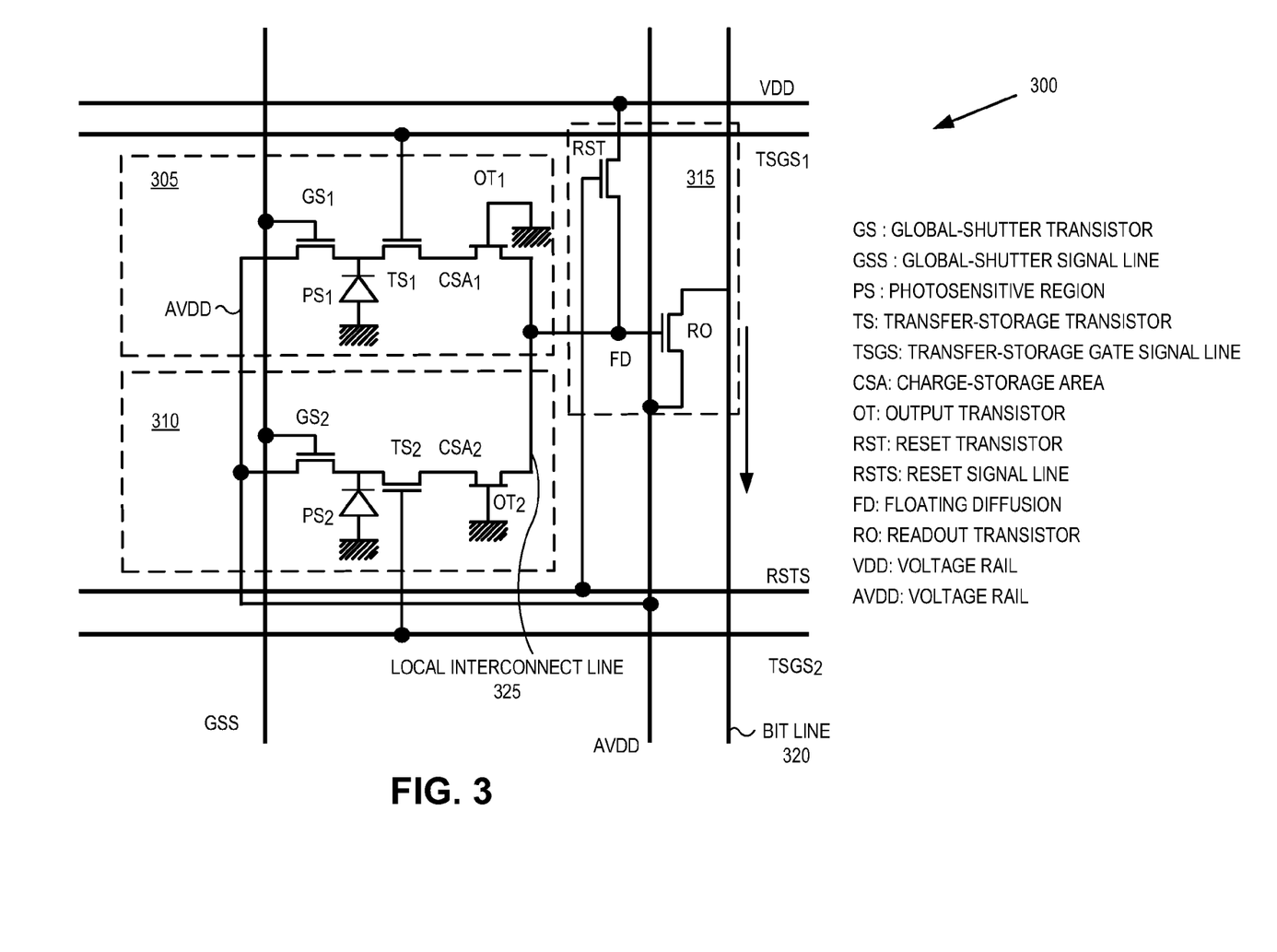
FIG. 3 is a circuit diagram illustrating adjacent pixels with shared pixel circuitry, each pixel including an output transistor with a gate tied to a fixed voltage potential, in accordance with an embodiment of the disclosure.
Figure 4:
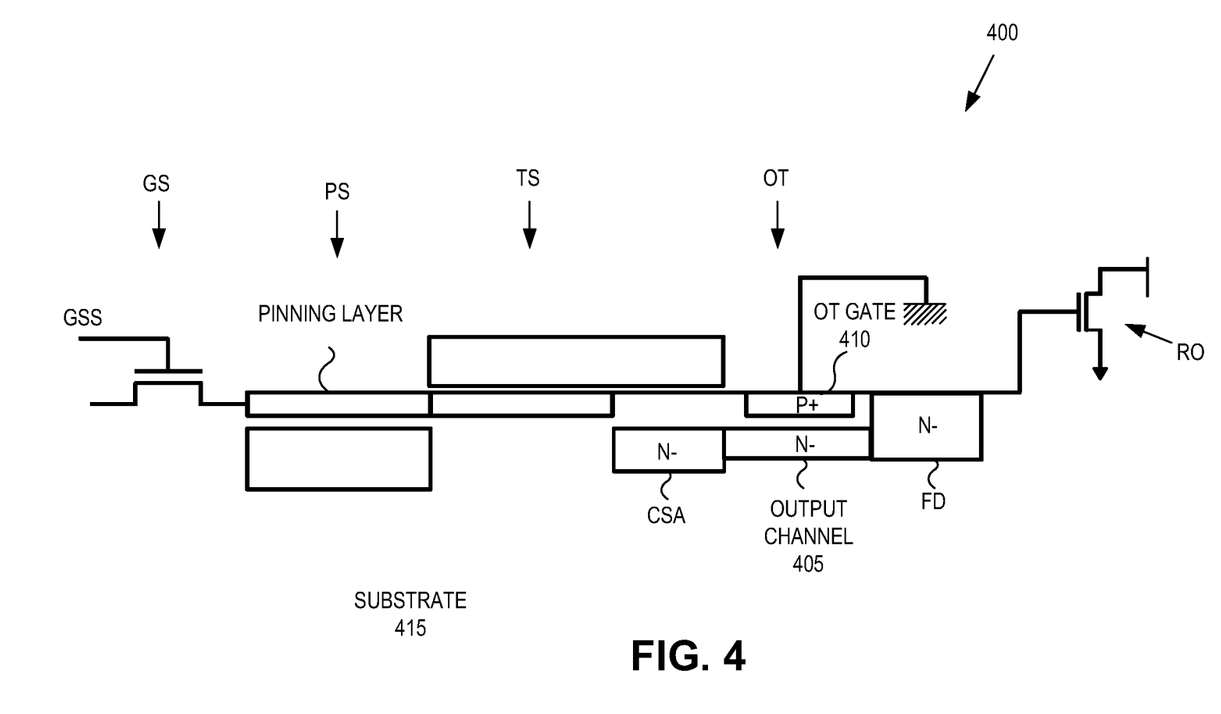
FIG. 4 is a symbolic cross-sectional view of pixel circuitry including a gate of an output transistor tied to a fixed voltage potential, in accordance with an embodiment of the disclosure.

FIG. 3 is a circuit diagram 300 illustrating adjacent pixels 305 and 310 with shared pixel circuitry 315, in accordance with an embodiment of the disclosure. Pixels 305 and 310 are one possible implementation of pixels within pixel array 205. FIG. 4 is a symbolic cross-sectional view of pixel circuitry 400, which is an example implementation of pixels either of pixels 305 or 310.

The illustrated embodiments of pixels 305 and 310 both include a photosensitive region PS, a transfer-storage transistor TS, a transfer-storage gate signal line TSGS, a charge-storage area CSA, an output transistor OT with a gate 410 tied to a fixed potential (e.g., ground), and a global-shutter transistor GS. The illustrated embodiment of circuit diagram 300 also includes voltage rails VDD and AVDD, a reset signal line RSTS, a global-shutter signal line GSS, a bit line 320, and a local interconnect line 325, all of which are routed within a metal stack (not illustrated) that exists within pixel array 205. The metal stack may include one or more metal layers separated by intermetal dielectric layers. In one embodiment, a first metal layer includes wires oriented in a first direction in pixel array 205 (e.g., horizontally or vertically), while a second metal layer includes only wires oriented substantially orthogonal to the wires in the first metal layer. In another embodiment, a first metal layer includes local interconnect line 325, which is oriented substantially orthogonal to the other wires in the first metal layer, thereby reducing the number of wires included in the second metal layer. In one embodiment, the first metal layer includes voltage rail VDD, transfer-storage gate signal line TSGS, reset signal line RSTS, and local interconnect line 325, while the second metal layer includes voltage rail AVDD, global-shutter signal line GSS, and bit line 320.

The illustrated embodiment of shared pixel circuitry 315 includes a floating diffusion region FD, readout transistor RO, and reset transistor RST. Floating diffusion region FD is coupled between readout transistor RO and output transistor OT of pixels 305 and 310. Enabling output transistor OT couples floating diffusion region FD to charge-storage area CSA via output channel 405.

In one embodiment, pixel circuitry 400 is disposed on or within a substrate 415. In one embodiment, substrate 415 is substantially comprised of silicon. In one embodiment, gate 410 and substrate 415 are P-type doped, while charge-storage area CSA and output channel 405 are N-type doped. In one embodiment, charge-storage area CSA and output channel 405 are lightly N-type doped, while output transistor gate 410 is heavily P-type doped and substrate 415 is lightly P-type doped. In one embodiment, the source and drain of output transistor OT correspond to charge-storage area CSA and floating diffusion region FD, respectively. In other embodiments, all of the doping polarities may be reversed. In one embodiment, output transistor OT is a junction gate field-effect transistor of depletion type with a negative threshold voltage. In one embodiment, gate 410 is spaced more than 0.18 μm from floating diffusion region FD.

Figure 5:
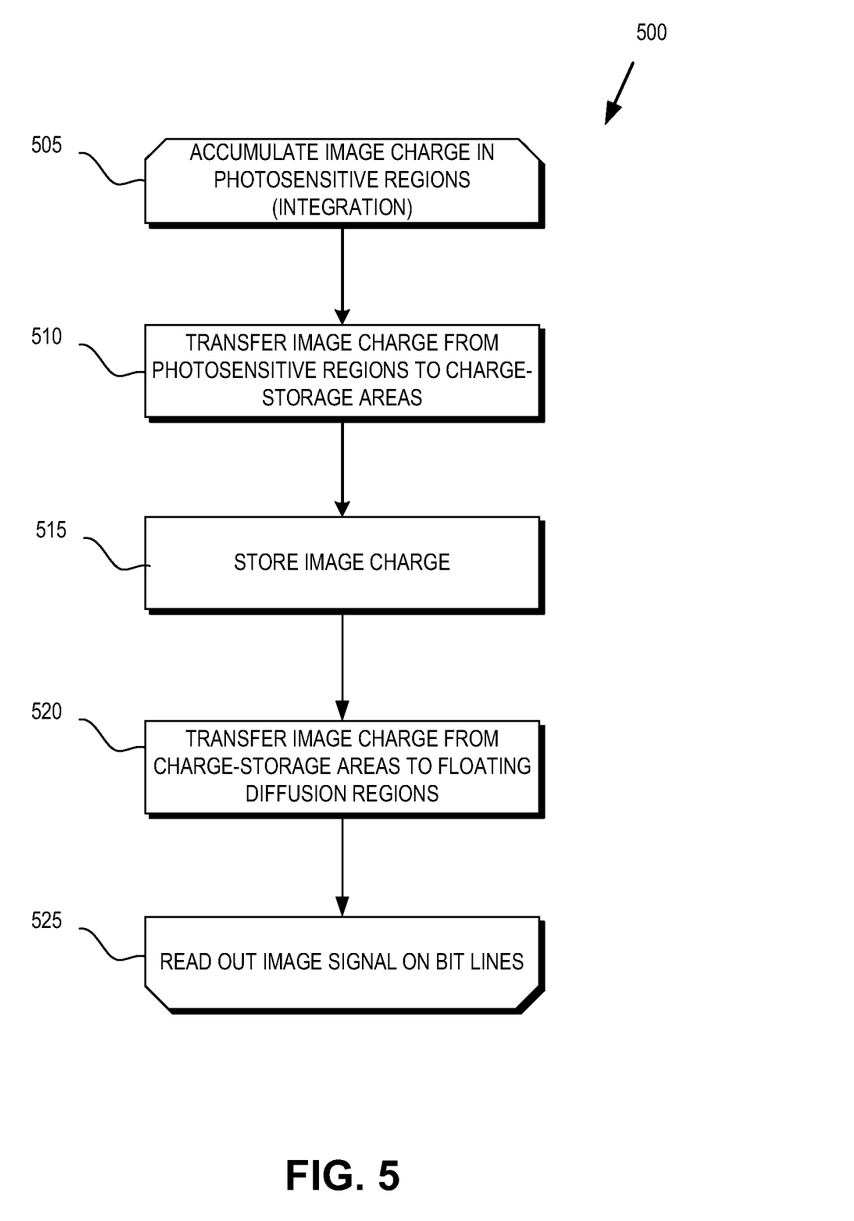
FIG. 5 is a flow chart illustrating a process for operating an imaging system, in accordance with an embodiment of the disclosure.

FIG. 5 is a flow chart illustrating a process 500 for operating image system 200, in accordance with an embodiment of the invention. Process 500 is described with reference to FIGS. 6A-6D. The order in which some or all of the process blocks appear in process 500 should not be deemed limiting. Rather, one of ordinary skill in the art having the benefit of the present disclosure will understand that some of the process blocks may be executed in a variety of orders not illustrated.

Figure 6A:
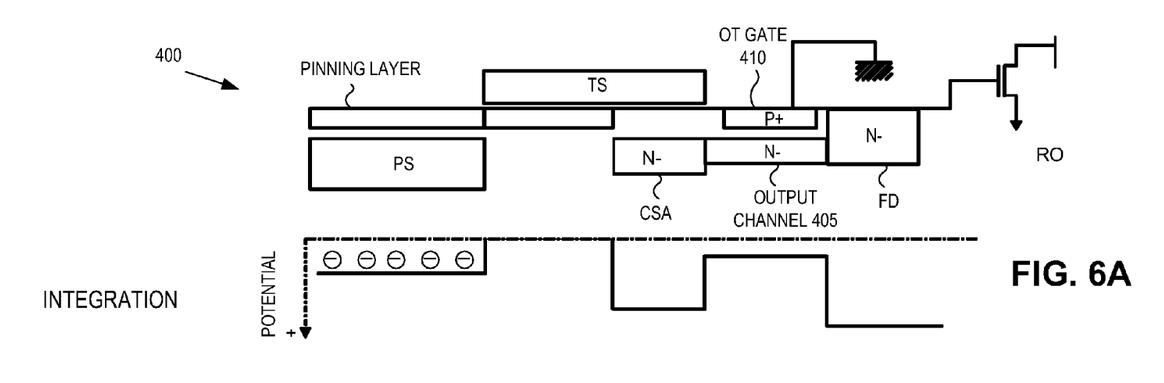
FIGS. 6A-6D illustrate various stages of charge transfer within a pixel including an output transistor having a gate tied to a fixed voltage potential, in accordance with an embodiment of the disclosure.

In a process block 505, image charge accumulates in photosensitive region PS in response to light incident upon photosensitive region PS (see FIG. 6A). In one embodiment, incoming photons of the incident light cause photo-generation of charge carriers, which then accumulate as image charge. In a global shutter image sensor, the integration occurs simultaneously for all pixels in pixel array 205.

Figure 6B:
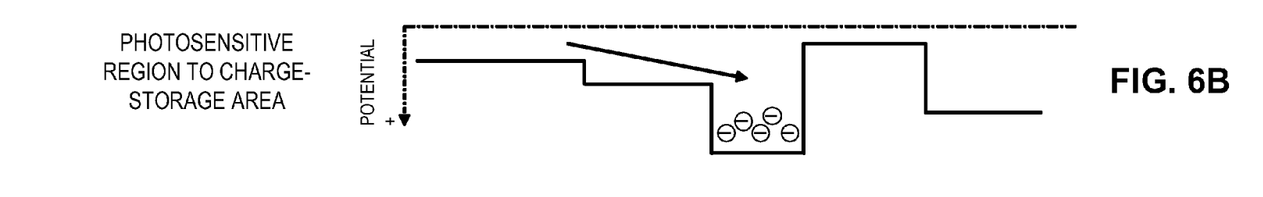

In a process block 510, image charge is transferred from photosensitive region PS to charge-storage area CSA by enabling transfer-storage transistor TS (see FIG. 6B). In one embodiment, transfer-storage transistor is enabled by applying a positive-voltage signal to transfer-storage transistor TS, thereby increasing the voltage potential between the gate of transfer-storage transistor TS and photosensitive region PS to greater than the threshold voltage of transfer-storage transistor TS. In one embodiment, the threshold voltage of transfer-storage transistor TS ranges from −0.5 to 0.8 volts. Enabling transfer-storage transistor TS couples photosensitive region PS to charge-storage area CSA. In the case of a global shutter image sensor, each pixel's corresponding transfer-storage transistor TS is simultaneously enabled in pixel array 205. This results in a global transfer of each pixel's corresponding image charge from its corresponding photosensitive region PS into its corresponding charge-storage area CSA.

Figure 6C:
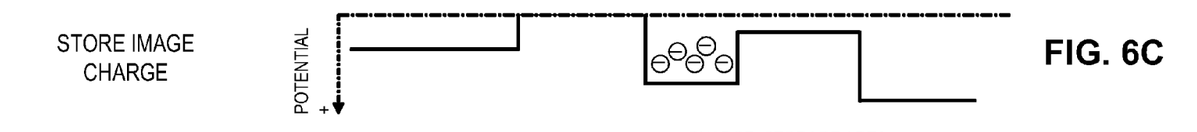
Figure 6D:
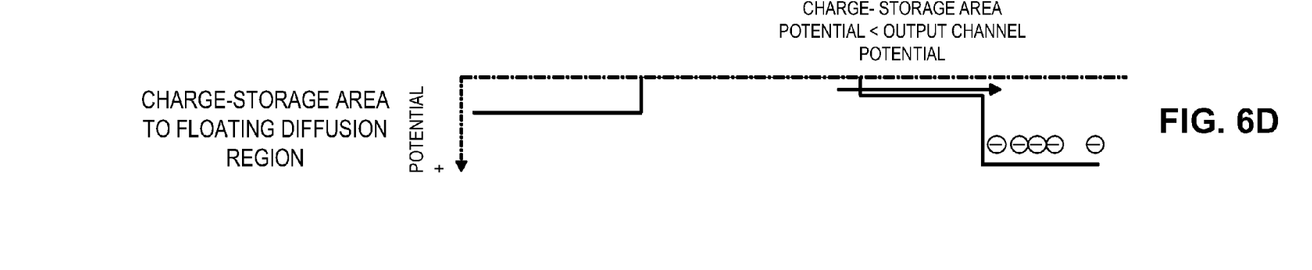

In a process block 515, image charge is stored in charge-storage area CSA (see FIG. 6C). The signal applied to transfer-storage transistor TS is de-asserted, thereby disabling transfer-storage transistor TS. Disabling transfer-storage transistor TS decouples photosensitive region PS from charge-storage area CSA and isolates the image charge in charge-storage area CSA.

In a process block 520, isolated image charge in charge-storage area CSA is transferred to floating diffusion region FD (see FIG. 6D) on a row by row basis within pixel array 205. Every transfer-storage transistor TS in a selected row of pixels in pixel array 205 receives a negative-voltage signal via transfer-storage gate signal line TSGS. This results in a decrease in the voltage potential of charge-storage area CSA. Decreasing the voltage potential of charge-storage area CSA increases the voltage potential between output transistor gate 410 (which is tied to a fixed potential) and charge-storage area CSA until the threshold voltage of output transistor OT is reached, thereby enabling output transistor OT and transferring the image charge to floating diffusion region FD via output channel 405. Thus, the transfer of image charge from charge-storage area CSA to floating diffusion region FD through output transistor OT is controlled, not via the selective application of a control signal to gate 410, but instead via a control signal received at transfer-storage transistor TS from transfer-storage signal gate line TSGS. Consequently, this reduces the number of wires needed to be routed within the metal stack of pixel array 205 and increase the fill factor each pixel. In one embodiment, the threshold voltage of output transistor OT ranges from −0.6 to −0.2 volts. In one embodiment, the voltage applied to the gate of transfer-storage transistor TS to enable output transistor OT ranges from −3.0 to −1.5 volts.

In a process block 525, image charge is read out on bit line 320 on a row by row basis. As illustrated by FIG. 3, a gate of readout transistor RO is coupled to floating diffusion region FD while readout transistor RO terminals are coupled to voltage rail AVDD and bit line 320. When image charge is transferred to the gate of readout transistor RO (i.e., at floating diffusion region FD), readout transistor RO produces a signal indicative of the image charge to readout circuitry 210 via bit line 320. In one embodiment, image charge from pixel 305 is read out during one row readout while image charge from pixel 310 is read out during a separate row readout.

Figure 7A:
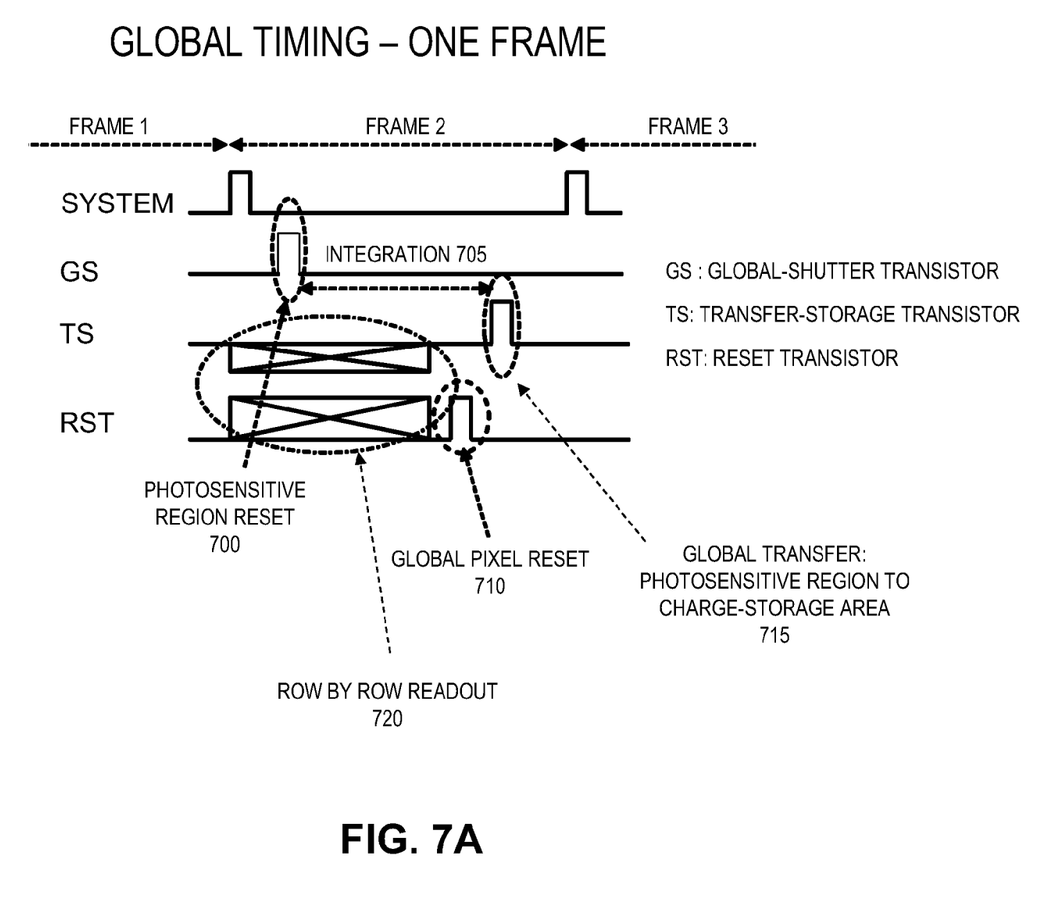
FIG. 7A is a timing diagram illustrating the operation of a global shutter image sensor, in accordance with an embodiment of the disclosure.

FIG. 7A is a timing diagram illustrating the operation of imaging system 200, in accordance with an embodiment of the disclosure. FIG. 7A illustrates one possible implementation of the timing of one frame (i.e., frame 2) of imaging system 200. In the present disclosure, a frame is the time allocated for both capturing image charge in each pixel in pixel array 205 and reading out image data captured during the previous frame. As illustrated, the operation of imaging system 200 includes an integration phase 705, in which image charge is accumulated in photosensitive region PS of each pixel in pixel array 205. Prior to integration phase 705, the voltage potential of photosensitive region PS for each pixel in pixel array 205 is reset to a fixed potential (photosensitive region reset 700). Similarly, subsequent to integration 705, the voltage potential of charge-storage area CSA for each pixel in pixel array 205 is reset (global pixel reset 710) before transferring the image charge collected during integration phase 705 to charge-storage area CSA (global transfer 715). The image charge transferred to charge-storage area CSA remains there until it is read out during the next frame (i.e., frame 3). While image charge accumulates during integration 705, image data captured during the previous frame (i.e., frame 1) is read out on a row by row basis to readout circuitry 210 (row by row readout 720).

Figure 7B:
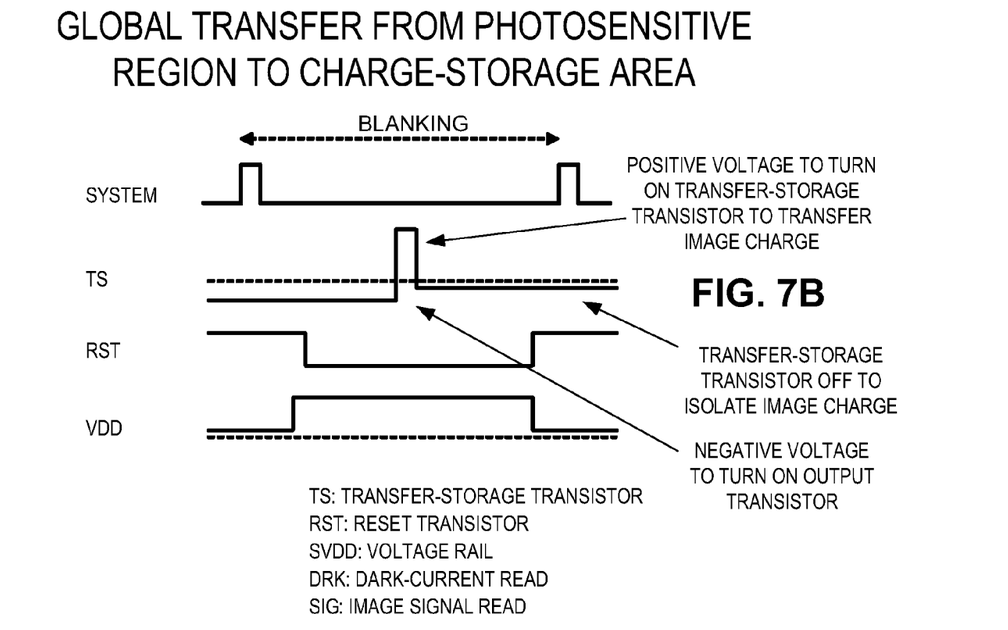
FIG. 7B is a timing diagram illustrating a global transfer of image charge from photosensitive regions to charge-storage areas, in accordance with an embodiment of the disclosure.

FIG. 7B is a timing diagram illustrating global pixel reset 710 and global transfer 715, in accordance with an embodiment of the disclosure. FIG. 7B illustrates one possible implementation of global pixel reset 710 and global transfer 715. In one embodiment, global pixel reset includes charging or discharging charge-storage area CSA to a predetermined voltage potential such as VDD. The reset is achieved by enabling output transistor OT by applying a negative-voltage to transfer-storage transistor TS and applying a positive-voltage signal to enable reset transistor RST. Simultaneously enabling output transistor OT and reset transistor RST couples voltage rail VDD, floating diffusion region FD, and charge-storage area CSA, thereby resetting charge-storage area CSA to the voltage potential of VDD. After charge-storage area CSA is reset, the signal applied to reset transistor RST is de-asserted, thereby disabling reset transistor RST and decoupling voltage rail VDD from floating diffusion FD.

Global transfer 715 occurs after global pixel reset 710, in which the image charge accumulated in photosensitive region PS during integration 705 is simultaneously transferred to charge-storage area CSA for each pixel in pixel array 205. As FIG. 7B illustrates, transfer-storage transistor TS receives a positive-voltage signal via transfer-storage gate signal line TSGS. This enables transfer-storage transistor TS and transfers image charge from photosensitive region PS to charge-storage area CSA. After the transfer is complete, transfer-storage transistor TS receives an intermediate-voltage signal via transfer-storage gate signal line TSGS. The intermediate-voltage signal is less than the threshold voltage of transfer-storage transistor TS, thereby disabling transfer-storage transistor TS and decoupling photosensitive region PS from charge-storage area CSA. However, the intermediate-voltage signal is not sufficiently negative to enable output transistor OT. With both transfer-storage transistor TS and output transistor OT disabled, the image charge remains isolated in charge-storage area CSA. In one embodiment, the intermediate-voltage signal is 0.4 volts below the threshold voltage of output transistor OT.

Figure 7C:
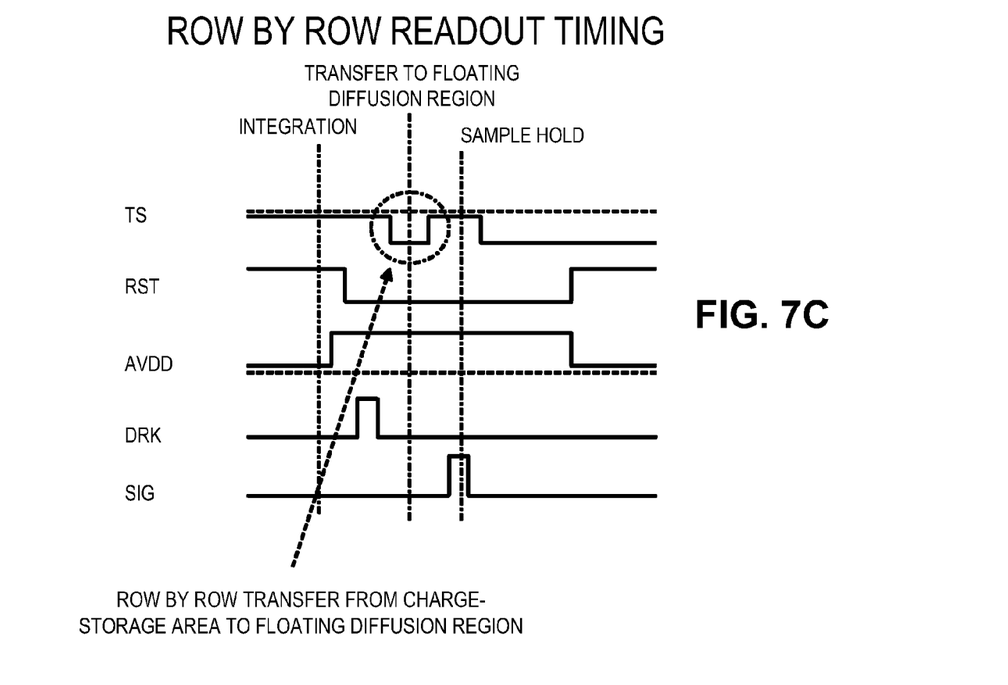
FIG. 7C is a timing diagram illustrating a row by row readout of image charge, in accordance with an embodiment of the disclosure.

FIG. 7C is a timing diagram illustrating row by row readout 720, in accordance with an embodiment of the disclosure. FIG. 7C is one possible implementation of row by row readout 720. In the illustrated embodiment, row by row readout 720 is implemented using correlated double sampling ("CDS"). Prior to reading out image data from a row of pixels in pixel array 205, floating diffusion region FD of each pixel in the selected row is reset. Resetting includes charging or discharging floating diffusion region FD to a predetermined voltage potential such as VDD and is achieved by enabling reset transistor RST. Enabling reset transistor RST couples voltage rail VDD to floating diffusion region FD.

CDS requires two readouts per pixel to readout circuitry 210: a dark-current read DRK and an image signal read SIG. Dark-current read DRK is executed to measure the voltage potential at floating diffusion region FD without image charge. Image signal read SIG is executed to measure the voltage potential at floating diffusion region FD with image charge, after image charge is transferred to floating diffusion region FD. Subtracting the dark-current read DRK measurement from the image signal read SIG measurement produces a reduced noise value indicative of the image charge at floating diffusion region FD.

Prior to image signal read SIG, image charge is transferred from charge-storage area CSA to floating diffusion region FD via output channel 405. To achieve this, transfer-storage transistor TS receives a negative-voltage signal via transfer-storage gate signal line TSGS, which enables output transistor OT. After the image charge transfers to floating diffusion region FD, transfer-storage transistor TS receives an intermediate-voltage signal via transfer-storage gate signal line to disable output transistor OT and isolate image charge in floating diffusion region FD. The intermediate-voltage signal is applied until after image signal read SIG is complete.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor including a pixel array, the image sensor comprising:
   a first photosensitive region of a first pixel disposed in or on a substrate layer to accumulate an image charge in response to light incident upon the first pixel; and
   first pixel circuitry of the first pixel disposed in or on the substrate layer, the first pixel circuitry including:

a first transfer-storage transistor coupled between the first photosensitive region and a first charge-storage area to transfer the image charge from the first photosensitive region to the first charge-storage area; and a first output transistor having a channel coupled between the first charge-storage area and a floating diffusion region to selectively transfer the image charge from the first charge-storage area to the floating diffusion region, wherein a gate of the first output transistor is coupled to a first fixed voltage potential and the image charge is selectively transferred from the first charge-storage area to the floating diffusion region in response to a control signal applied to a gate of the first transfer-storage transistor, wherein the first output transistor is a junction gate field-effect transistor.

2. The image sensor of claim 1, wherein the first pixel circuitry further includes:

a readout transistor having a gate coupled to the floating diffusion region to produce an image signal on a bit line indicative of the image charge at the floating diffusion region; and a reset transistor coupled between a first voltage rail and the floating diffusion region to reset the first pixel.

3. The image sensor of claim 2, further comprising a second pixel disposed adjacent to the first pixel including:

a second photosensitive region; and second pixel circuitry of the second pixel disposed in or on the substrate layer, the second pixel circuitry including:

a second transfer-storage transistor coupled between the second photosensitive region and a second charge-storage area; and a second output transistor having a channel coupled between the second charge-storage area and the floating diffusion region, wherein a gate of the second output transistor is coupled to a second fixed voltage potential, wherein the first and second pixel share the readout and reset transistors.

4. The image sensor of claim 3, further comprising:

a first global-shutter transistor coupled between a second voltage rail and the first photosensitive region to reset the first photosensitive region; and a second global-shutter transistor coupled between the second voltage rail and the second photosensitive region to reset the second photosensitive region.

5. The image sensor of claim 4, wherein a gate of the first global-shutter transistor and a gate of the second global-shutter transistor are coupled to a global-shutter signal line to reset the first and second photosensitive regions simultaneously.

6. The image sensor of claim 3, wherein the gates of the first and second output transistors are coupled to the substrate layer to ground the gates of the first and second output transistors.

7. The image sensor of claim 3, further comprising a local interconnect that couples the first output transistor to the second output transistor, wherein the local interconnect is coupled to the floating diffusion region.

8. The image sensor of claim 7, further including a metal stack to route signals, wherein the metal stack includes:

a first metal layer comprised of conductors, wherein the majority of the conductors are substantially parallel to one another; and a second metal layer comprised of conductors, wherein the majority of the conductors are both substantially parallel to one another within the second metal layer and substantially orthogonal to the majority of the conductors in the first metal layer, wherein the local interconnect is disposed in the metal stack such that the local interconnect is substantially orthogonal to the majority of the conductors in the metal layer in which the local interconnect is disposed.

9. The image sensor of claim 3, the pixel array further comprising:

a first group of conductors that span the rows of the pixel array, including:

a first transfer-storage transistor gate signal line coupled to the first transfer-storage transistor;

a second transfer-storage transistor gate signal line coupled to the second transfer-storage transistor;

a reset signal line coupled to a gate of the reset transistor; and the first voltage rail coupled to the gate of the reset transistor;

a second group of conductors that span the columns of the pixel array, including:

the bit line coupled to the readout transistor to send the image signal to readout circuitry;

a second voltage rail coupled to the readout transistor and coupled to a first global-shutter transistor and a second global-shutter transistor; and a global-shutter signal line coupled to gates of the first and second global-shutter transistors to provide a photosensitive reset signal.

10. An image sensor including a pixel array, the image sensor comprising:

a first photosensitive region of a first pixel disposed in or on a substrate layer to accumulate an image charge in response to light incident upon the first pixel; and first pixel circuitry of the first pixel disposed in or on the substrate layer, the first pixel circuitry including:

a first transfer-storage transistor coupled between the first photosensitive region and a first charge-storage area to transfer the image charge from the first photosensitive region to the first charge-storage area; and a first output transistor having a channel coupled between the first charge-storage area and a floating diffusion region to selectively transfer the image charge from the first charge-storage area to the floating diffusion region, wherein a gate of the first output transistor is coupled to a first fixed voltage potential and the image charge is selectively transferred from the first charge-storage area to the floating diffusion region in response to a control signal applied to a gate of the first transfer-storage transistor, wherein:

the first transfer-storage transistor is coupled to transfer the image charge from the first photosensitive region to the first charge-storage area in response to a first voltage level of the control signal, the first transfer-storage transistor is coupled to store the image charge in the first charge-storage area in response to a second voltage level of the control signal, the first transfer-storage transistor is coupled to transfer the image charge from the first charge-storage area to the floating diffusion region in response to a third voltage level of the control signal, and the second voltage level is between the first and third voltage levels of the control signal.

11. A method of operating an image sensor, comprising:
accumulating a first image charge on a first photosensitive region of a first pixel in response to light incident upon the first photosensitive region;
transferring the first image charge from the first photosensitive region to a first charge-storage area by temporarily enabling a first transfer-storage transistor coupled between the first photosensitive region and the first charge-storage area;
storing the first image charge in the first charge-storage area;
temporarily enabling a first output transistor having a gate coupled to a first fixed voltage potential by applying a first control signal to a gate of the first transfer-storage transistor;
transferring the first image charge from the first charge-storage area to a floating diffusion region through the first output transistor while the first control signal is applied to the gate of the first transfer-storage transistor, wherein the first output transistor is coupled between the first charge-storage area and the floating diffusion region;
enabling the first transfer-storage transistor by applying a first voltage level of the first control signal to the first transfer-storage transistor;
storing the first image charge in the first charge-storage area by applying a second voltage level of the first control signal to the first transfer-storage transistor; and
enabling the first output transistor by applying a third voltage level of the first control signal to the first transfer-storage transistor,
wherein the second voltage level is between the first and third voltage levels.

12. The method of claim 11, further comprising:
producing a signal on a bit line indicative of the first image charge at the floating diffusion region; and
resetting the first pixel by temporarily enabling a reset transistor coupled between the floating diffusion region and a first voltage rail.

13. The method of claim 12, further comprising:
accumulating a second image charge on a second photosensitive region of a second pixel;
transferring the second image charge from the second photosensitive region to a second charge-storage area;
storing the second image charge in the second charge-storage area; and
temporarily enabling a second output transistor having a gate coupled to a second fixed voltage potential by applying a second control signal to a gate of the second transfer-storage transistor; and
transferring the second image charge from the second charge-storage area to a floating diffusion region through the second output transistor while the second control signal is applied to the gate of the second transfer-storage transistor, wherein the econd output transistor is coupled between the second charge-storage area and the floating diffusion region.

14. The method of claim 13, further comprising:
resetting the first photosensitive region by temporarily enabling a first global-shutter transistor coupled between a second voltage rail and the first photosensitive region; and
resetting the second photosensitive region by temporarily enabling a second global-shutter transistor coupled between the second voltage rail and the second photosensitive region.

15. The method of claim 14, further comprising resetting both the first photosensitive region and the second photosensitive region by applying a reset signal to both a gate of the first global-shutter transistor and a gate of the second global-shutter transistor simultaneously, wherein the gate of the first global-shutter transistor is coupled to the gate of the second global-shutter transistor.

16. The method of claim 13, wherein the gates of the first and second output transistor are coupled to a substrate layer to ground the gates of the first and second output transistors.

17. The method of claim 13, further comprising:
transferring the first image charge from the first charge-storage area to the floating diffusion region while a subsequent first image charge accumulates in the first photosensitive region; and
transferring the second image charge from the second charge-storage area to the floating diffusion region while a subsequent second image charge accumulates in the second photosensitive region.

18. An image sensor including a pixel array, the image sensor comprising:
a first photosensitive region of a first pixel disposed in or on a substrate layer to accumulate an image charge in response to light incident upon the first pixel;
first pixel circuitry of the first pixel disposed in or on the substrate layer, the first pixel circuitry including:
a first transfer-storage transistor coupled between the first photosensitive region and a first charge-storage area to transfer the image charge from the first photosensitive region to the first charge-storage area; and
a first output transistor having a channel coupled between the first charge-storage area and a floating diffusion region to selectively transfer the image charge from the first charge-storage area to the floating diffusion region, wherein a gate of the first output transistor is coupled to a first fixed voltage potential and the image charge is selectively transferred from the first charge-storage area to the floating diffusion region in response to a control signal applied to a gate of the first transfer-storage transistor;
a second pixel disposed adjacent to the first pixel including a second photosensitive region and second pixel circuitry of the second pixel disposed in or on the substrate layer, the second pixel circuitry including:
a second transfer-storage transistor coupled between the second photosensitive region and a second charge-storage area; and
a second output transistor having a channel coupled between the second charge-storage area and the floating diffusion region, wherein a gate of the second output transistor is coupled to a second fixed voltage potential, wherein the first and second pixel share the readout and reset transistors;
a local interconnect that couples the first output transistor to the second output transistor, wherein the local interconnect is coupled to the floating diffusion region; and
a metal stack to route signals, wherein the metal stack includes:
a first metal layer comprised of conductors, wherein the majority of the conductors are substantially parallel to one another; and
a second metal layer comprised of conductors, wherein the majority of the conductors are both substantially parallel to one another within the second metal layer and substantially orthogonal to the majority of the conductors in the first metal layer, wherein the local interconnect is disposed in the metal stack such that the local interconnect is substantially orthogonal to the majority of the conductors in the metal layer in which the local interconnect is disposed.

* * * * *